United States Patent
Hawrylchak et al.

(10) Patent No.: US 12,125,698 B2
(45) Date of Patent: Oct. 22, 2024

(54) INTEGRATED EPITAXY AND PRECLEAN SYSTEM

(71) Applicant: Applied Materials, Inc., Santa Clara, CA (US)

(72) Inventors: Lara Hawrylchak, Gilroy, CA (US); Schubert S. Chu, San Francisco, CA (US); Tushar Mandrekar, San Jose, CA (US); Errol C. Sanchez, Tracy, CA (US); Kin Pong Lo, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/516,326

(22) Filed: Nov. 1, 2021

(65) Prior Publication Data

US 2022/0059342 A1 Feb. 24, 2022

Related U.S. Application Data

(62) Division of application No. 16/100,399, filed on Aug. 10, 2018, now Pat. No. 11,164,737.
(Continued)

(51) Int. Cl.
*H01L 21/02* (2006.01)
*B08B 7/00* (2006.01)
(Continued)

(52) U.S. Cl.
CPC ...... *H01L 21/02049* (2013.01); *B08B 7/0035* (2013.01); *C23C 16/0209* (2013.01);
(Continued)

(58) Field of Classification Search
CPC ... B08B 7/0035; C23C 16/0245; C30B 25/02; H01L 21/02046; H01L 21/02049; H01L 21/02661
See application file for complete search history.

(56) References Cited

U.S. PATENT DOCUMENTS

2003/0017628 A1   1/2003  Li et al.
2003/0196588 A1*  10/2003  Kobayashi ........ H01L 21/67306
117/84
(Continued)

FOREIGN PATENT DOCUMENTS

CN   105453233 A   3/2016
JP   2007537582 A   12/2007
(Continued)

OTHER PUBLICATIONS

International Search Report and Written Opinion Dec. 4, 2018 for Application No. PCT/US2018/046501.
(Continued)

*Primary Examiner* — Matthew J Song
(74) *Attorney, Agent, or Firm* — Patterson + Sheridan, LLP

(57) ABSTRACT

Implementations of the present disclosure generally relates to a transfer chamber coupled to at least one vapor phase epitaxy chamber a plasma oxide removal chamber coupled to the transfer chamber, the plasma oxide removal chamber comprising a lid assembly with a mixing chamber and a gas distributor; a first gas inlet formed through a portion of the lid assembly and in fluid communication with the mixing chamber; a second gas inlet formed through a portion of the lid assembly and in fluid communication with the mixing chamber; a third gas inlet formed through a portion of the lid assembly and in fluid communication with the mixing chamber; and a substrate support with a substrate supporting surface; a lift member disposed in a recess of the substrate supporting surface and coupled through the substrate support to a lift actuator; and a load lock chamber coupled to the transfer chamber.

9 Claims, 7 Drawing Sheets

Related U.S. Application Data

(60) Provisional application No. 62/552,107, filed on Aug. 30, 2017.

(51) Int. Cl.

| | |
|---|---|
| *C23C 16/02* | (2006.01) |
| *C23C 16/24* | (2006.01) |
| *C23C 16/30* | (2006.01) |
| *C23C 16/455* | (2006.01) |
| *C23C 16/505* | (2006.01) |
| *C23C 16/54* | (2006.01) |
| *C30B 25/02* | (2006.01) |
| *H01J 37/32* | (2006.01) |
| *H01L 21/3213* | (2006.01) |
| *H01L 21/67* | (2006.01) |
| *H01L 21/687* | (2006.01) |

(52) U.S. Cl.
CPC .......... *C23C 16/0245* (2013.01); *C23C 16/24* (2013.01); *C23C 16/30* (2013.01); *C23C 16/45565* (2013.01); *C23C 16/505* (2013.01); *C23C 16/54* (2013.01); *C30B 25/02* (2013.01); *H01J 37/32082* (2013.01); *H01J 37/32357* (2013.01); *H01J 37/32513* (2013.01); *H01J 37/32522* (2013.01); *H01J 37/32899* (2013.01); *H01L 21/02046* (2013.01); *H01L 21/02315* (2013.01); *H01L 21/02381* (2013.01); *H01L 21/02532* (2013.01); *H01L 21/0262* (2013.01); *H01L 21/02661* (2013.01); *H01L 21/32136* (2013.01); *H01L 21/67103* (2013.01); *H01L 21/67109* (2013.01); *H01L 21/67115* (2013.01); *H01L 21/67184* (2013.01); *H01L 21/67207* (2013.01); *H01L 21/67248* (2013.01); *H01L 21/68742* (2013.01); *H01J 2237/334* (2013.01); *H01J 2237/335* (2013.01)

(56) References Cited

U.S. PATENT DOCUMENTS

| | | |
|---|---|---|
| 2007/0020890 A1 | 1/2007 | Thakur et al. |
| 2007/0113868 A1 | 5/2007 | Fu et al. |
| 2007/0181057 A1 | 8/2007 | Lam et al. |
| 2007/0232031 A1* | 10/2007 | Singh ............... H01L 21/02532 438/479 |
| 2008/0118663 A1 | 5/2008 | Choi et al. |
| 2008/0202425 A1 | 8/2008 | Gelatos et al. |
| 2009/0017227 A1 | 1/2009 | Fu et al. |
| 2011/0061810 A1 | 3/2011 | Ganguly et al. |
| 2012/0034761 A1 | 2/2012 | Kuppurao et al. |
| 2014/0011339 A1 | 1/2014 | Zheng et al. |
| 2014/0227881 A1 | 8/2014 | Lubomirsky et al. |
| 2015/0040822 A1 | 2/2015 | Olsen et al. |
| 2015/0056814 A1 | 2/2015 | Ling et al. |
| 2015/0072533 A1* | 3/2015 | Muraki ............. H01L 21/76897 156/345.35 |
| 2015/0079803 A1* | 3/2015 | Huang ............. H01L 21/02617 438/758 |
| 2016/0118223 A1* | 4/2016 | Agarwal ................. H05H 1/46 315/111.21 |
| 2016/0138161 A1 | 5/2016 | Chen et al. |
| 2016/0312360 A1 | 10/2016 | Rasheed et al. |
| 2018/0127876 A1* | 5/2018 | Tolle ...................... C23C 16/52 |

FOREIGN PATENT DOCUMENTS

| | | |
|---|---|---|
| JP | 2009525611 A | 7/2009 |
| JP | 2016528734 A | 9/2016 |
| KR | 20110019445 A | 2/2011 |
| KR | 20150013637 A | 2/2015 |
| KR | 20160042010 A | 4/2016 |
| TW | 201207920 A | 2/2012 |
| TW | 201523694 A | 6/2015 |
| TW | 201721712 A | 6/2017 |

OTHER PUBLICATIONS

Japanese Office Action dated Apr. 1, 2021, for Japanese Patent Application No. 2020-512543.
Korean Office Action dated May 5, 2021, for Korean Patent Application No. 10-2020-7008636.
Korean Notice of Allowance dated Jul. 6, 2021, for Korean Patent Application No. 10-2020-7008636.
Taiwan Patent Application No. 107128243, Office Action and Search Report dated Apr. 29, 2022, 10 pages.
Japanese Application No. 2002-023955, Office Action dated Nov. 29, 2022, 8 pages.
1 Chinese Patent Application No. 201880056028.3, Office Action dated Mar. 8, 2023, 10 pages.
Taiwan Application No. 111141075, Office Action dated Nov. 17, 2023, 7 pages.

* cited by examiner

INTEGRATED EPITAXY AND PRECLEAN SYSTEM

CROSS-REFERENCE TO RELATED APPLICATION

This application is a divisional application of U.S. Pat. No. 11,164,737, filed Aug. 10, 2018, which claims benefit of U.S. Provisional Patent Application Ser. No. 62/552,107, filed Aug. 30, 2017, both of which are hereby incorporated by reference herein.

FIELD

Implementations of the present disclosure generally relate to an apparatus and a method for cleaning a surface of a substrate.

BACKGROUND

Integrated circuits are formed in and on silicon and other semiconductor substrates. In the case of single crystal silicon, substrates are made by growing an ingot from a bath of molten silicon, and then sawing the solidified ingot into multiple substrates. An epitaxial silicon layer may then be formed on the monocrystalline silicon substrate to form a defect free silicon layer that may be doped or undoped. Semiconductor devices, such as transistors, may be manufactured from the epitaxial silicon layer. The electrical properties of the formed epitaxial silicon layer are generally better than the properties of the monocrystalline silicon substrate.

Surfaces of the monocrystalline silicon and the epitaxial silicon layer are susceptible to contamination when exposed to typical substrate fabrication facility ambient conditions. For example, a native oxide layer may form on the monocrystalline silicon surface prior to deposition of the epitaxial layer due to handling of the substrates and/or exposure to ambient environment in the substrate processing facility. Additionally, foreign contaminants such as carbon and oxygen species present in the ambient environment may deposit on the monocrystalline surface. The presence of a native oxide layer or contaminants on the monocrystalline silicon surface negatively affects the quality of an epitaxial layer subsequently formed on the monocrystalline surface. It is therefore desirable to pre-clean the substrates in order to remove the surface oxidation and other contaminants before epitaxial layers are grown on the substrates. However, pre-clean processes are often carried out in one or more stand-alone vacuum process chambers, which may increase substrate handling time and chances of exposing substrates to ambient environment.

Therefore, there is a need in the art to provide an improved substrate processing system for cleaning a substrate surface prior to performing an epitaxial deposition process that minimizes substrate handling time and exposure to ambient environment.

SUMMARY

This disclosure describes a processing system, comprising a transfer chamber coupled to at least one film formation chamber; a plasma oxide removal chamber coupled to the transfer chamber, the plasma oxide removal chamber comprising a remote plasma source and a substrate support comprising a cooling channel and a heater; and a load lock chamber coupled to the transfer chamber.

Also described herein is a method of processing a substrate, comprising removing oxide from a substrate by a process that includes exposing the substrate to a processing gas comprising $NH_3$, HF, and radicals; and forming a film on the substrate by a vapor phase epitaxy process.

Also described herein is a processing apparatus, comprising a first transfer chamber coupled to at least one vapor phase epitaxy chamber; a plasma oxide removal chamber coupled to the transfer chamber, the plasma oxide removal chamber comprising a lid assembly with a mixing chamber and a gas distributor; a first gas inlet formed through a portion of the lid assembly and in fluid communication with the mixing chamber; a second gas inlet formed through a portion of the lid assembly and in fluid communication with the mixing chamber; a third gas inlet formed through a portion of the lid assembly and in fluid communication with the mixing chamber; and a substrate support with a substrate supporting surface; a cooling channel and one or more resistive heaters embedded in the substrate support; and a lift member disposed in a recess of the substrate supporting surface and coupled through the substrate support to a lift actuator; and a load lock chamber coupled to the transfer chamber.

BRIEF DESCRIPTION OF THE DRAWINGS

Implementations of the present disclosure, briefly summarized above and discussed in greater detail below, can be understood by reference to the illustrative implementations of the disclosure depicted in the appended drawings. It is to be noted, however, that the appended drawings illustrate only typical implementations of this disclosure and are therefore not to be considered limiting of its scope, for the disclosure may admit to other equally effective implementations.

Figure 1:
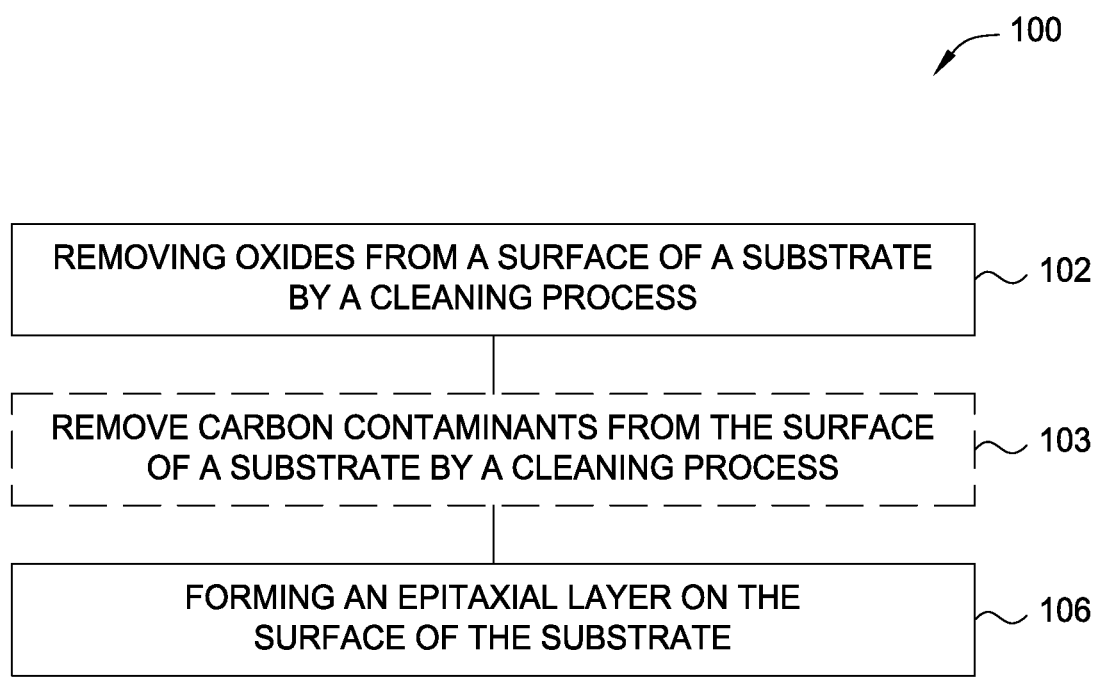
FIG. 1 illustrates a processing sequence in accordance with one implementation of the present disclosure.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

FIG. 1 illustrates a processing sequence 100 in accordance with one implementation of the present disclosure. In box 102, oxides are removed from a surface of a semiconductor substrate using a cleaning process. The substrate may include a silicon containing material and the surface may include a material, such as silicon (Si), germanium (Ge) or silicon germanium alloys (SiGe). In some implementations, the Si, Ge, or SiGe surface may have an oxide layer, such as a native oxide layer, and contaminants disposed thereon. Due to the sensitivity of epitaxial deposition processes to oxides and contaminants, such as carbon containing contaminants, surface contamination resulting from exposure to most typical cleanroom environments for a few hours can become significant enough for the accumulated oxides and contaminants to affect the quality of a subsequently formed epitaxial layer.

The substrate surface may be cleaned by performing an oxides removal process and a contaminant removal process. In one implementation, the oxides are removed from the surface of the substrate using a cleaning process (box 102), and the contaminants, such as carbon containing contaminants, are removed from the surface of the substrate using a reducing process, for example. The cleaning process may include a plasma process. The plasma process may use a plasma formed form a gas including hydrogen ($H_2$), helium (He), argon (Ar), ammonia ($NH_3$), a fluorine containing gas such as $NF_3$, HF, or any combination of these gases. The plasma may be inductively or capacitively coupled, or the plasma may be formed by a microwave source in a processing chamber. The processing chamber may be a remote plasma chamber that is spatially separated from a processing region in which the substrate is disposed. The term "spatially separated" described herein may refer to a plasma formation region that is separated from a substrate processing region by one or more chamber components such as a blocker plate 228 and a gas distributor 230 shown in FIG. 2A, or even a conduit between a remote plasma chamber and a substrate processing chamber.

In one implementation, the plasma is formed using a capacitively coupled plasma source. Radicals from the plasma may pass through a gas distribution plate disposed above the substrate, which is positioned on a support at a temperature of about 5 degrees Celsius to about 100 degrees Celsius, such as a temperature of about 5 degrees Celsius to about 75 degrees Celsius, for example about 10 degrees Celsius. The processing pressure may be at subatmospheric pressure, for example a pressure between about 500 mTorr and about 20 Torr, such as between about 2 Torr and about 10 Torr. Radicals reach the substrate and then react with the surface oxides. Exemplary processing chambers that can be adapted to perform the plasma etching process include the SiCoNi™ or Selectra™ chambers, which are available from Applied Materials, Inc., of Santa Clara, California. Chambers from other manufacturers may also be used.

In one exemplary implementation, the plasma cleaning process is a remote plasma assisted dry cleaning process which involves the concurrent exposure of a substrate to HF and $NH_3$, optionally including plasma by-products of one or more of the gases. Inert gases such as argon and helium may also be used. Any one, or combination of the three gases, inert/HF/$NH_3$ may be exposed to energy, as described above, to form a plasma thereof. The plasma is mixed with the other gases for charging to the process chamber, or the plasma and other gases may be provided to the process chamber along different pathways, mixing upon arrival to the process chamber. In one example, the plasma cleaning process may be similar to or may include a SiCoNi™ process that is available from Applied Materials, Inc., of Santa Clara, California.

The remote plasma process can be largely conformal and selective for oxide layers, and thus does not readily etch silicon, germanium, or nitride layers regardless of whether the layers are amorphous, crystalline or polycrystalline. Selectivity of the HF/$NH_3$ plasma cleaning process for oxide versus silicon or germanium is at least about 3:1, and usually 5:1 or better, sometimes 10:1. The HF/$NH_3$ plasma cleaning process is also highly selective of oxide versus nitride. The selectivity of the HF/$NH_3$ plasma cleaning process versus nitride is at least about 3:1, usually 5:1 or better, sometimes 10:1.

In some embodiments, either during the remote plasma process or after performing the remote plasma process, an amount of thermal energy can be applied to the processed substrate to help remove any generated by-products. In some embodiments, the thermal energy is provided via a radiant, convective and/or conductive heat transfer process that causes the unwanted by-products found on the substrate surface to sublimate.

In optional box 103, a second cleaning process may be performed by removing carbon contaminants from the surface of the substrate. In box 106, an epitaxial layer is formed on the surface of the substrate. If cleaned prior, as described above, the surface of the substrate is uniformly oxide and contaminant free which improves the quality of layers subsequently formed on the surface of the substrate. An exemplary epitaxial process may be a selective epitaxial process performed at a temperature that is less than about 800 degrees Celsius, for example about 450 to 650 degrees Celsius. The epitaxial layer may be formed using a high temperature chemical vapor deposition (CVD) process. The epitaxial layer may be a crystalline silicon, germanium, or silicon germanium, or any suitable semiconductor material such as a Group III-V compound or a Group II-VI compound. In one exemplary thermal CVD process, processing gases such as chlorosilanes $SiH_xCl_{4-x}$ (mono, di, tri, tetra), silanes $Si_xH_{2X+2}$ (silane, disilane, trisilane, etc.), germanes $Ge_xH_{2x+2}$ (germane, digermane, etc.), hydrogen chloride HCl, chlorine gas $Cl_2$, or combinations thereof are used to form the epitaxial layer. The processing temperature is under 800 degrees Celsius, such as about 300 degrees Celsius to about 600 degrees Celsius, for example about 450 degrees Celsius, and the processing pressure is between 5 Torr and 600 Torr. An exemplary processing chamber that can be used to perform the epitaxial deposition process is the Centura™ Epi chamber, which is available from Applied Materials, Inc., of Santa Clara, California. Chambers from other manufacturers may also be used.

Boxes 102, 103 and 106 may be performed in one processing system, such as the processing system illustrated in FIG. 9, and further described below. An optional thermal treatment may also be performed between or after the processes 102 and 103, before performing the layer formation process of 106, to remove any residual by-products or contaminants, and to anneal the surface to remove any surface defects. Such an anneal may be performed under a hydrogen atmosphere, optionally including an inert gas such as argon and helium, and may be performed at temperatures of 400 to 800 degrees Celsius and pressures from 1 Torr to 300 Torr.

Figure 2A:
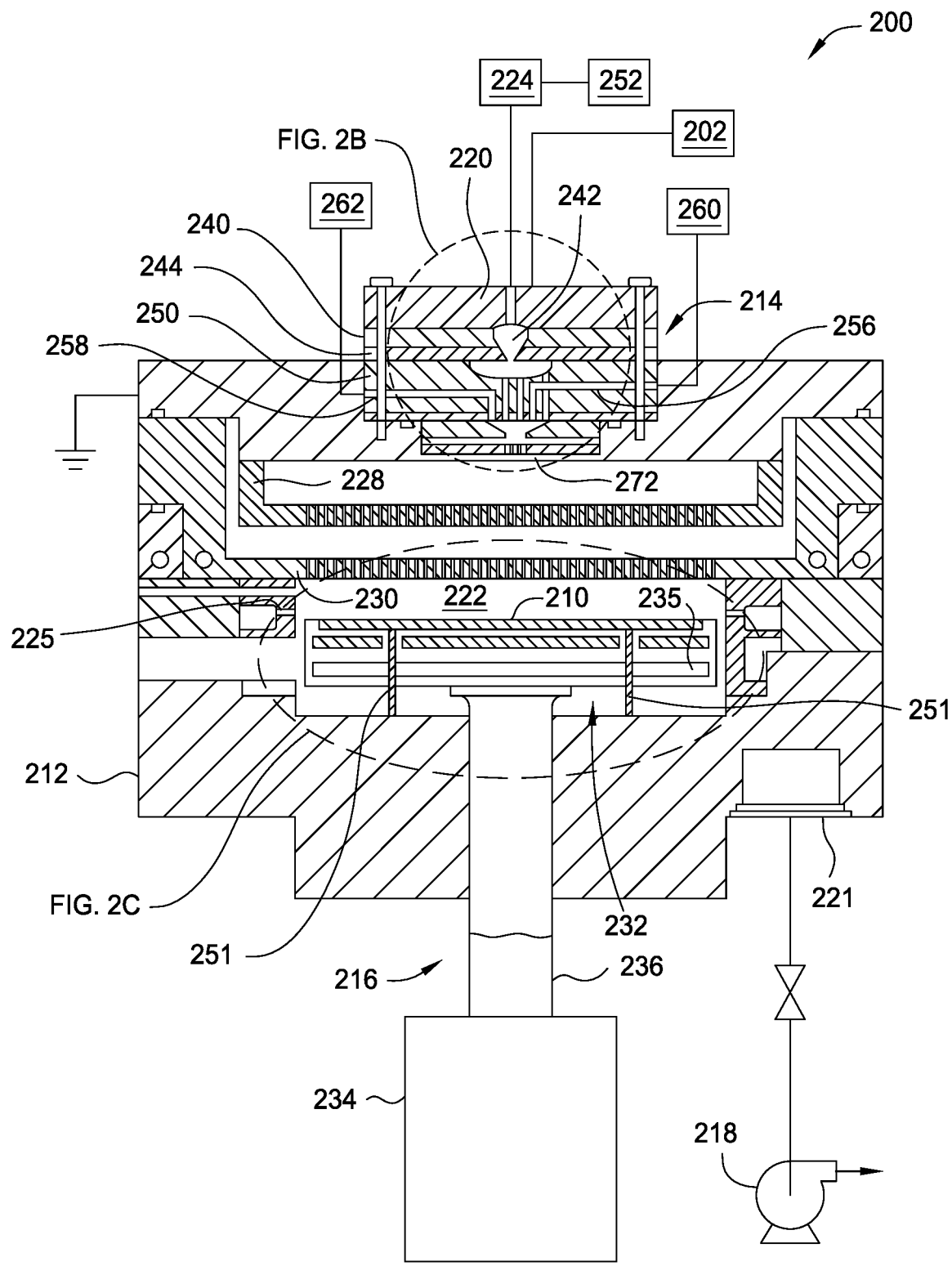
FIG. 2A is a cross-sectional view of a cleaning chamber used to perform a cleaning process of FIG. 1 in accordance with one implementation of the present disclosure.
Figure 2B:
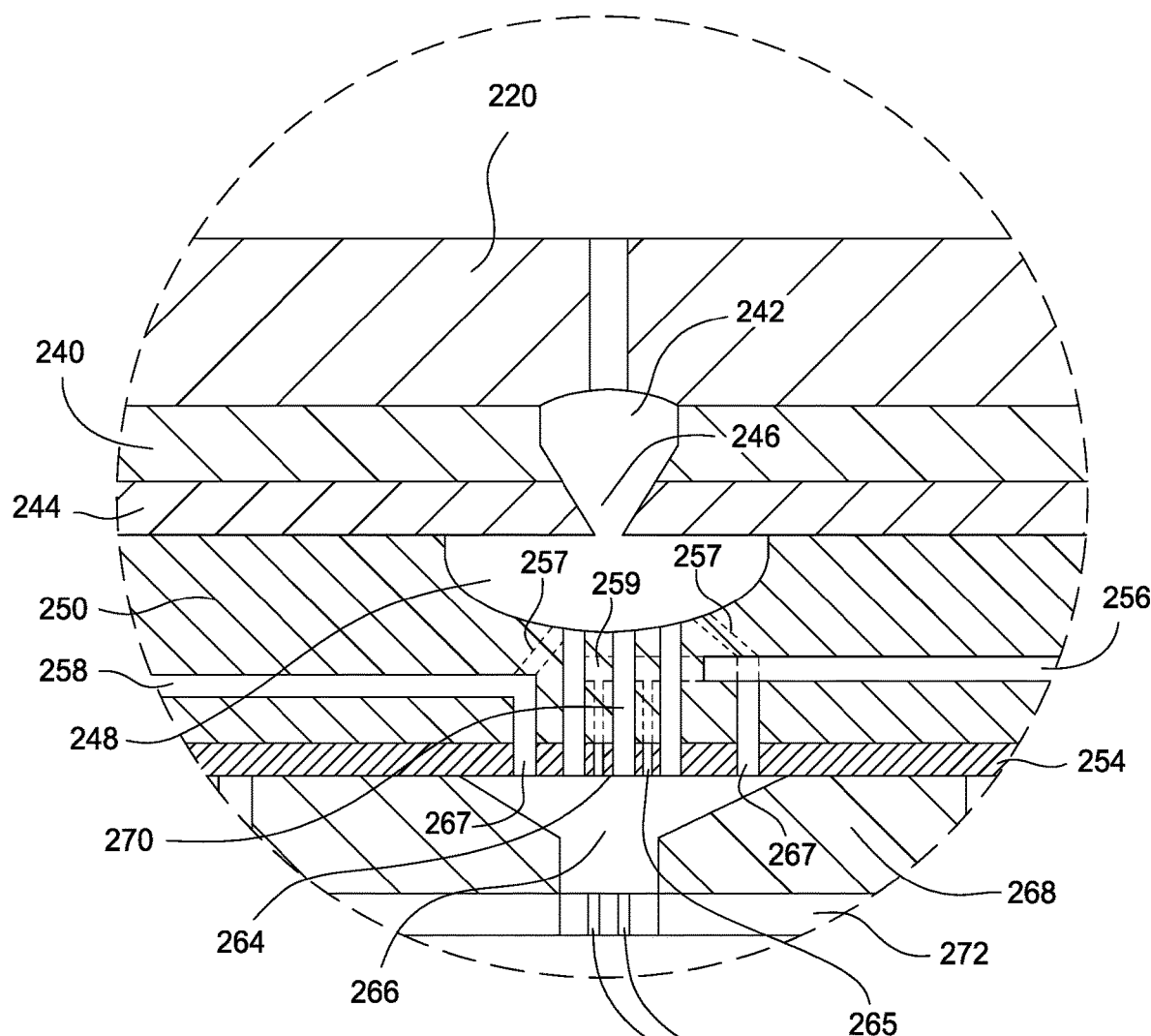
FIG. 2B is an enlarged view of a portion of the processing chamber of FIG. 2A.

FIG. 2A is a cross sectional view of a processing chamber 200 that is adapted to perform at least some of the processes found in box 102, and thus is configured to remove contaminants, such as oxides, from a surface of a substrate. FIG. 2B is an enlarged view of a portion of the processing chamber 200 of FIG. 2A.

The processing chamber 200 may be particularly useful for performing a thermal or plasma-based cleaning process and/or a plasma assisted dry etch process. The processing chamber 200 includes a chamber body 212, a lid assembly 214, and a support assembly 216. The lid assembly 214 is disposed at an upper end of the chamber body 212, and the support assembly 216 is at least partially disposed within the chamber body 212. A vacuum system can be used to remove gases from processing chamber 200. The vacuum system includes a vacuum pump 218 coupled to a vacuum port 221 disposed in the chamber body 212. The processing chamber 200 also includes a controller 202 for controlling processes within the processing chamber 200.

The lid assembly 214 includes a plurality of stacked components configured to provide precursor gases and/or a plasma to a processing region 222 within the chamber 200. A first plate 220 is coupled to a second plate 240. A third plate 244 is coupled to the second plate 240. The lid assembly 214 may be connected to a power source 224 for supplying a plasma to a cone-shaped chamber 242 formed in the lid assembly 214. The lid assembly 214 can also be connected to a remote plasma source that creates the plasma upstream of the lid stack. The remote plasma cavity (e.g., items 222, 220, 240 in FIGS. 2A-2B) is coupled to a gas source 252 (or the gas source 252 is coupled directly to the lid assembly 214 in the absence of the remote plasma source 224). The gas source 252 may include a gas source that is configured to provide helium, argon, or other inert gas. In some configurations, the gas provided by the gas source 252 can be energized into a plasma that is provided to the lid assembly 214 by use of the remote plasma source 224. In alternate embodiments, the gas source 252 may provide process gases that can be activated by the remote plasma source 224 prior to being introduced to a surface of the substrate that is disposed within the processing chamber 200. Referring to FIG. 2B, the cone-shaped chamber 242 has an opening 246 that allows a formed plasma to flow from the remote plasma source 224 to a volume 248 formed in a fourth plate 250 of the lid assembly 214.

In some configurations of the lid assembly 214, a plasma is generated within the cone-shaped chamber 242 by the application of energy delivered from a plasma source. In one example, the energy can be provided by biasing the lid assembly 214 to capacitively couple RF, VHF and/or UHF energy to the gases positioned in the cone-shaped chamber 242. In this configuration of the lid assembly 214, the remote plasma source 224 may not be used, or not be installed within the lid assembly 214.

A central conduit 270, which is formed in fourth plate 250, is adapted to provide the plasma generated species provided from the volume 248 through a fifth plate 254 to a mixing chamber 266 formed in a sixth plate 268 of the lid assembly 214. The central conduit 270 communicates with the mixing chamber 266 through an opening 264 in the fifth plate 254. The opening 264 may have a diameter less than, greater than or the same as a diameter of the central conduit 270. In the embodiment of FIG. 2B, the opening 264 has diameter the same as the central conduit 270.

The fourth plate 250 also includes a plurality of inlets 256 and 258 that are configured to provide gases to the mixing chamber 266. The inlet 256 is coupled to a first gas source 260 and the inlet 258 is coupled to a second gas source 262. The first gas source 260 and the second gas source 262 may include processing gases as well as inert gases, for example noble gases such as argon and/or helium, utilized as a carrier gas. The first gas source 260 may include ammonia ($NH_3$) as well as argon. The second gas source 262 may contain fluorine containing gases, hydrogen containing gases, or a combination thereof. In one example, the second gas source 262 may contain hydrogen fluoride (HF) as well as argon.

As illustrated in FIG. 2B, in some configurations, the inlet 256 is coupled to the mixing chamber 266 through a cylindrical channel 259 (shown in phantom) and a plurality of holes 265 formed in the plate 254. The inlet 258 is coupled to the mixing chamber 266 through a cylindrical channel 257 (shown in phantom) and a plurality of holes 267 formed in the fifth plate 254. The holes 265, 267 formed in the plate 254 are generally sized so that they enable a uniform flow of gases, which are provided from their respective gas source 260, 262, into the mixing chamber 266. In one configuration, the holes 267 have a diameter that is less than a width of the opening defined by the opposing sidewalls of the cylindrical channel 257 formed fourth plate 250. The holes 267 are typically distributed around the circumference of the center-line of the cylindrical channel 257 to provide uniform fluid flow into the mixing chamber 266. In one configuration, the holes 265 have a diameter that is less than a width of the opening defined by the opposing sidewalls of the cylindrical channel 259 formed fourth plate 250. The holes 265 are typically distributed around the circumference of the center-line of the cylindrical channel 259 to provide uniform fluid flow into the mixing chamber 266.

The inlets 256 and 258 provide respective fluid flow paths laterally through the fourth plate 250, turning toward and penetrating through the fifth plate 254 to the mixing chamber 266. The lid assembly 214 also includes a seventh plate or first gas distributor 272, which may be a gas distribution plate, such as a showerhead, where the various gases mixed in the lid assembly 214 are flowed through perforations 274 formed therein. The perforations 274 are in fluid communication with the mixing chamber 266 to provide flow pathways from the mixing chamber 266 through the first gas distributor 272. Referring back to FIG. 2A, a blocker plate 228 and a gas distribution plate, such as a second gas distributor 230, which may be a gas distribution plate, such as a showerhead, is disposed below the lid assembly 214.

Alternatively, a different cleaning process may be utilized to clean the substrate surface. For example, a remote plasma containing He and $NH_3$ may be introduced into the processing chamber 200 through the lid assembly 214, while $NH_3$ may be directly injected into the processing chamber 200 via a separate gas inlet 225 that is disposed at a side of the chamber body 212 and coupled to a gas source (not shown).

The support assembly 216 may include a substrate support 232 to support a substrate 210 thereon during processing. The substrate support 232 may be coupled to an actuator 234 by a shaft 236 which extends through a centrally-located opening formed in a bottom of the chamber body 212. The actuator 234 may be flexibly sealed to the chamber body 212 by bellows (not shown) that prevent vacuum leakage around the shaft 236. The actuator 234 allows the substrate support 232 to be moved vertically within the chamber body 212 between a processing position and a loading position. The loading position is slightly below the opening of a tunnel (not shown) formed in a sidewall of the chamber body 212.

The substrate support 232 has a flat, or a substantially flat, substrate supporting surface for supporting a substrate to be processed thereon. The substrate support 232 may be moved vertically within the chamber body 212 by actuator 234, which is coupled to the substrate support 232 by shaft 236. For some steps, the substrate support 232 may be elevated to a position in close proximity to the lid assembly 214 to control the temperature of the substrate 210 being processed.

As such, the substrate 210 may be heated via radiation emitted from the second gas distributor 230, or another radiant source, or by convection or conduction from the second gas distributor 230 through an intervening gas. In some process steps, the substrate may be disposed on lift pins 251 to perform additional thermal processing steps, such as performing an annealing step.

Figure 2C:
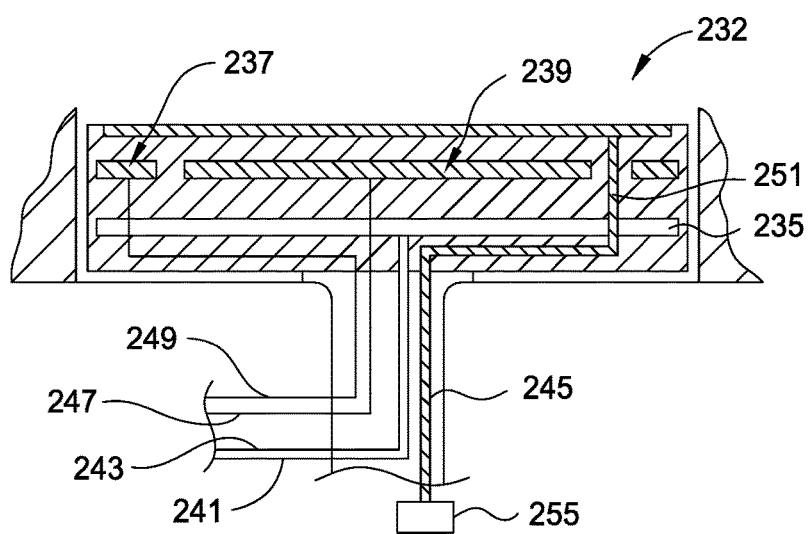
FIG. 2C is an enlarged cross-sectional view of a substrate support according to one embodiment.

FIG. 2C is an enlarged cross-sectional view of the substrate support 232 of FIG. 2A. The substrate support 232 includes a thermal control plenum 235 in fluid communication with a fluid supply conduit 241 and a fluid return conduit 243, each of the conduits 241 and 243 disposed through the shaft 236. The thermal control plenum 235 may be a cooling feature for the substrate support 232 by circulating a cooling fluid through the fluid supply conduit 241, into the thermal control plenum 235, and out through the fluid return conduit 243.

The substrate support 232 may also include a plurality of heaters 237 and 239. The plurality of heaters, in this embodiment, includes a first heater 237 and a second heater 239. The first and second heaters 237 and 239 are disposed in a substantially coplanar relationship within the substrate support 232 at a location to enable thermal coupling between the heaters and the substrate supporting surface. The first heater 237 is disposed at a periphery of the substrate support 232, and the second heater 239 is disposed in a central area of the substrate support 232, to provide zonal temperature control. Each of the first and second heaters 237 and 239 may be resistive heaters that are coupled to power sources (not shown) by respective power conduits 249 and 247, each disposed through the shaft 236.

In operation, temperature control may be provided by concurrent operation of the thermal control plenum 235 and the heaters 237 and 239. The thermal control plenum 235 may be supplied with a cooling fluid, as described above, and power may be provided to the heaters 237 and 239, as resistive heaters. In this way, separate control circuits may be tuned to provide fast response for one item, for example the heaters 237 and 239, and slower response for the thermal control plenum 235, or vice versa. At a minimum, different control parameters may be applied to the thermal control plenum 235, the first heater 237, and the second heater 239 to accomplish an optimized, zonal temperature control system.

As shown in FIG. 2C, a separate lift member 245 may be included in the support assembly 216. A recess may be provided in the substrate supporting surface to accommodate the lift pins 251 of the member 245 when the substrate rests on the substrate supporting surface. The lift member 245 may be coupled to a lift actuator 255 by an extension of the lift member 245 disposed through the shaft 236. The lift actuator may move the lift member 245 vertically to lift the substrate off the substrate supporting surface toward the first gas distributor 272. The lift member 245 may be a hoop, such as an open hoop or a closed hoop, which may be U-shaped, circular, horseshoe-shaped, or any convenient shape. The lift member 245 has a thickness to provide structural strength when lifting a substrate. In one example, the lift member is made of a ceramic material and is about 1 mm thick.

Figure 3:
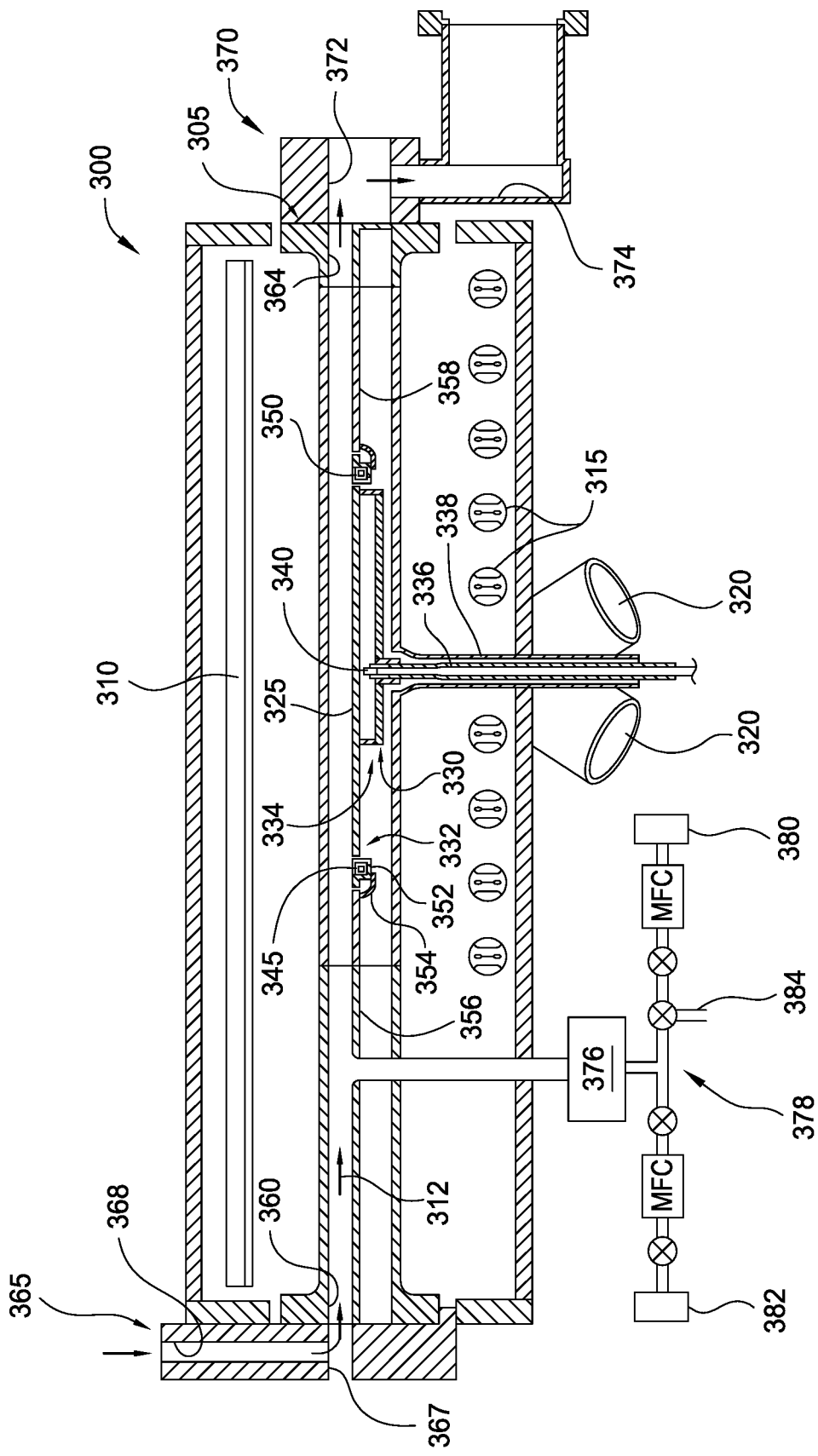
FIG. 3 illustrates single substrate chemical vapor deposition (CVD) reactor for performing an epitaxial deposition process.

FIG. 3 illustrates single substrate chemical vapor deposition (CVD) reactor 300, including a quartz process chamber or reaction chamber 305, according to one embodiment. The reactor 300 may be utilized for CVD of a number of different materials, including SiGe and Ge films as disclosed herein. Moreover, the illustrated reactor 300 can accomplish multiple deposition steps in the same chamber 305, as will be apparent from the discussion below.

The reactor 300 may generally have the shape of a rectangular box. A plurality of radiant heat sources is supported outside the process chamber 305 to provide heat energy in the process chamber 305 without appreciable absorption by walls of the process chamber 305. While the embodiments are described in the context of a "cold wall" CVD reactor for processing semiconductor substrates, it will be understood that the methods described herein will have utility in conjunction with other heating/cooling systems, such as those employing inductive or resistive heating.

The radiant heat sources comprise an upper heating assembly comprising a plurality of elongated heating elements 310 (only one is shown in this view). The heating elements 310 are elongated tube-type radiant heating elements, such as lamps. The heating elements 310 are disposed in spaced-apart parallel relationship and also substantially parallel with a reactant gas flow path (shown by arrow 312) through the process chamber 305. A lower heating assembly comprises similar heating elements 315, such as lamps, positioned below the process chamber 305, and oriented transverse to the heating elements 310. A portion of the radiant heat is diffusely reflected into the process chamber 305 by rough specular reflector plates (not shown) above and below the upper and lower heating elements 310, 315, respectively. Additionally, a plurality of spot lamps 320 supply concentrated heat to the underside of the substrate support structure (described below), to counteract a heat sink effect created by cold support structures extending through the bottom of the process chamber 305. In some embodiments, each of the heating elements 310, 315 is a high intensity tungsten filament lamp producing radiant heat energy transmitted through the walls of the process chamber 305 without appreciable absorption. As is known in the art of semiconductor processing equipment, the power of the various heating elements 310, 315, 320 can be controlled independently or in grouped zones in response to temperature sensors.

A workpiece, comprising a silicon substrate 325, is shown supported within the process chamber 305 upon a substrate support structure 330. The illustrated support structure 330 includes a substrate holder 332, upon which the substrate 325 rests, and a support spider 334. The spider 334 is mounted to a shaft 336, which extends downwardly through a tube 338 extending through the chamber lower wall. The tube 338 communicates with a source of purge gas which can flow during processing of a substrate. The purge gas may be utilized to inhibit process gases from entering the lower section of the process chamber 305. The purge gas may also flow horizontally beneath the substrate 325.

A plurality of temperature sensors is positioned in proximity to the substrate 325. The temperature sensors may take a variety of forms, such as optical pyrometers or thermocouples. In the illustrated embodiment, the temperature sensors comprise thermocouples, including a first or central thermocouple 340, suspended below the substrate holder 332 in any suitable fashion. The central thermocouple 340 passes through the spider 334 in proximity to the substrate holder 332. The reactor 300 further includes a plurality of secondary or peripheral thermocouples, also in proximity to the substrate 325, including a leading edge or front thermocouple 345, a trailing edge or rear thermocouple 350, and a side thermocouple (not shown). Each of the peripheral thermocouples is housed within a slip ring 352, which surrounds the substrate holder 332 and the substrate 325. Each of the central and peripheral thermocouples are connected to a temperature controller, which sets the power of the various heating elements 310, 315, 320 in response to the readings of the thermocouples.

In addition to housing the peripheral thermocouples, the slip ring 352 absorbs and emits radiant heat during high temperature processing. The slip ring 352 may be utilized to compensate for a greater heat loss or absorption at the substrate edges, a phenomenon which is known to occur due to a greater ratio of surface area to volume in regions near the substrate edges. By minimizing edge losses, slip ring 352 can reduce the risk of radial temperature non-uniformities across the substrate 325. The slip ring 352 can be suspended by any suitable means. For example, the illustrated slip ring 352 rests upon support members 354, which extend from a front chamber divider 356, and a rear chamber divider 358. The dividers 356, 358 desirably are formed of quartz. In some arrangements, the rear divider 358 can be omitted.

The illustrated process chamber 305 includes an inlet port 360 for the injection of reactant and carrier gases, and the substrate 325 can also be received therethrough. An outlet port 364 is on the opposite side of the process chamber 305, with the substrate support structure 330 positioned between the inlet port 360 and outlet port 364.

An inlet component 365 is fitted to the process chamber 305, adapted to surround the inlet port 360, and includes a horizontally elongated slot 367 through which the substrate 325 can be inserted. A generally vertical inlet 368 receives gases from gas sources and communicates such gases with the slot 367 and the inlet port 360. While not separately illustrated in FIG. 3, the gas sources may include hydrogen, silicon and germanium precursors, and a controller (e.g., preprogrammed computer) that controls a sequence of steps as described herein, including flowing the surface active compound into the chamber during a cool down step prior to Si and/or Ge deposition. The inlet 368 can include gas injectors designed to maximize uniformity of gas flow for the single-substrate reactor.

An outlet component 370 similarly mounts to the process chamber 305 such that an exhaust opening 372 aligns with the outlet port 364 and leads to exhaust conduits 374. The conduits 374, in turn, can communicate with suitable vacuum means (not shown) for exhausting process gases from the process chamber 305. In one embodiment, process gases are drawn through the process chamber 305 and a downstream scrubber (not shown). A pump or fan is preferably included to aid in drawing process gases through the process chamber 305, and to evacuate the chamber for reduced pressure processing, i.e., below atmospheric pressure but above ultra-high vacuum pressure ranges, as discussed below.

The illustrated reactor 300 also includes a source 376 of excited species, positioned upstream from the reactor 300. The excited species source 376 of the illustrated embodiment comprises a remote plasma generator, including a magnetron power generator and an applicator along a gas line 378. In the illustrated embodiment, microwave energy from a magnetron is coupled to a flowing gas in an applicator along the gas line 378. A precursor gas source 380 is coupled to the gas line 378 for introduction into the excited species source 376. A carrier gas source 382 is also coupled to the gas line 378. One or more branch lines 384 can also be provided for additional reactants. As is known in the art, the gas sources 380, 382 can comprise gas tanks, bubblers, etc., depending upon the form and volatility of the reactant species. Each gas line can be provided with a separate mass flow controller (MFC) and valves, as shown, to allow selection of relative amounts of carrier and reactant species introduced to the source 376 and thence into the process chamber 305. The excited species source 376 can be employed for plasma enhanced deposition, but also may be utilized for exciting etchants for cleaning the chamber 305 of excess deposition when no substrate is in the chamber 305.

The total volume capacity of the single-substrate process chamber 305 designed for processing 200 mm substrates, for example, is less than about 30 liters, such as less than about 20 liters, and in one embodiment is less than about 10 liters. The illustrated chamber 305 has a capacity of about 7.5 liters. Because the illustrated process chamber 305 is partitioned by the dividers 356, 358, substrate holder 332, ring 352, and the purge gas flowing from the tube 338, the effective volume through which process gases flow is around half the total volume (e.g., about 3.77 liters in the illustrated embodiment). It is understood that the volume of the single-substrate process chamber 305 can be different, depending upon the size of the substrates for which the process chamber 305 is designed to accommodate. For example, a single-substrate process chamber 305 for 300 mm substrates has a capacity of less than about 100 liters, such as about 60 liters, and in one embodiment is less than about 30 liters. In one example, the single-substrate process chamber 305 for processing a 300 mm substrate has a total volume of about 24 liters, with an effective volume of about 12 liters.

Deposition temperatures for a Ge-containing layer are typically in the range of about 250 degrees Celsius (C) to about 600 degrees C., for example about 300 degrees C. to about 450 degrees C. For example, lower deposition temperatures tend to be more appropriate as the thermal stability of the precursor decreases. The total pressure in the single-substrate process chamber 305 is in the range of about 10-5 Torr to about 800 Torr. In some embodiments, the pressure is about 200 mTorr to about 760 Torr, such as about 1 Torr to about 200 Torr, for example about 1 Torr to about 60 Torr.

Figure 4:
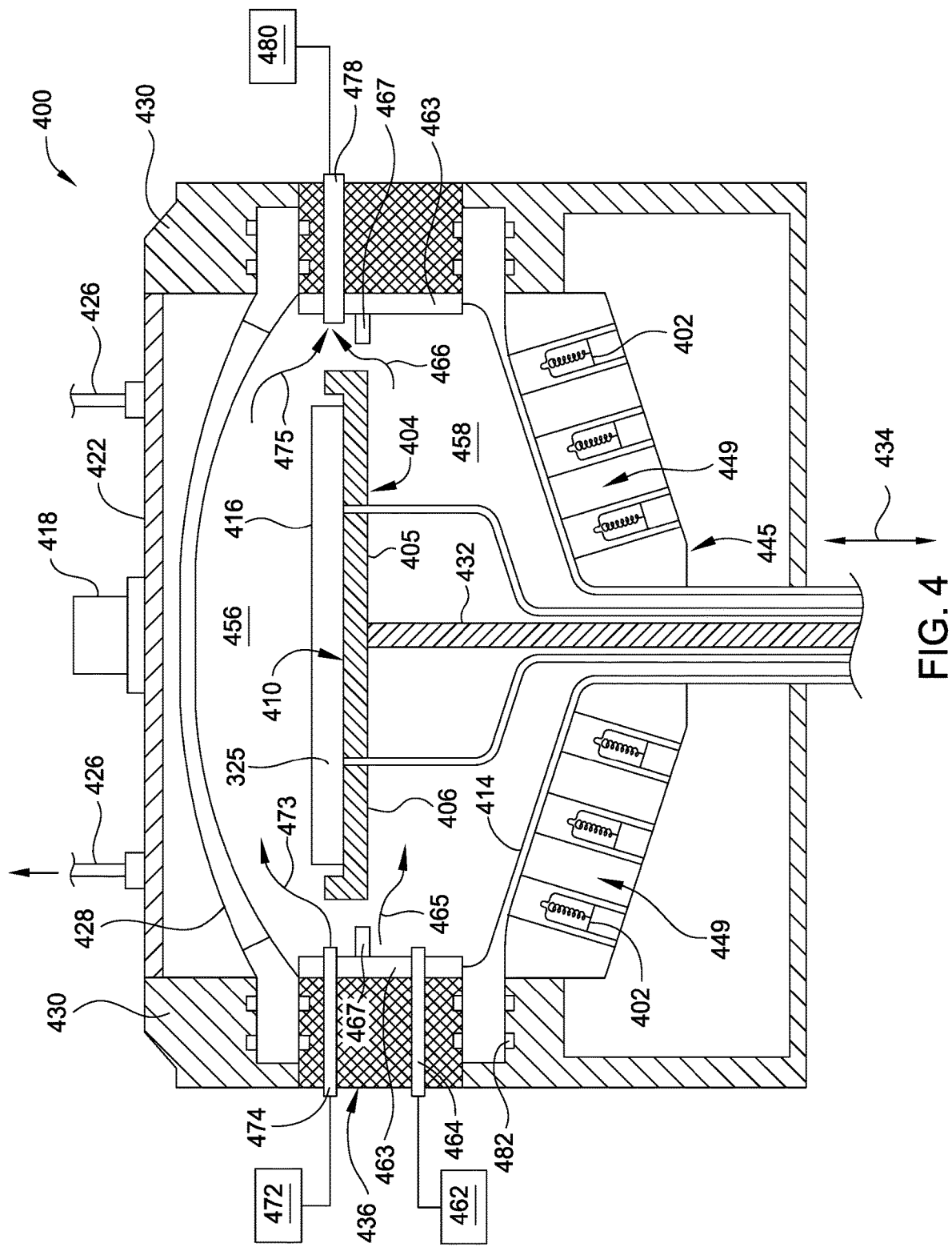
FIG. 4 illustrates a schematic sectional view of a backside heating process chamber for performing an epitaxial deposition process.

FIG. 4 illustrates a schematic sectional view of a backside heating process chamber 400 configured for low pressure epitaxial deposition according to one embodiment. The process chamber 400 may be used to process one or more substrates, including the deposition of a material on an upper surface of a substrate 325. The process chamber 400 may include an array of radiant heating lamps 402 for heating, among other components, a back side 404 of a substrate support 406 disposed within the process chamber 400. The substrate support 406 may be a disk-like substrate support 406 as shown, or may be a ring-like substrate support (having a central opening), which supports the substrate from the edge of the substrate to facilitate exposure of the substrate to the thermal radiation of the lamps 402.

The substrate support 406 is located within the process chamber 400 between an upper dome 428 and a lower dome 414. The upper dome 428, the lower dome 414 and a base ring 436 that is disposed between the upper dome 428 and lower dome 414 generally define an internal region of the process chamber 400. The substrate 325 (not to scale) is transferred into the process chamber 400 and positioned onto the substrate support 406 through a loading port not shown in this view.

The substrate support 406 is supported by a central shaft 432, which moves the substrate 325 in a vertical direction 434 during loading and unloading, and in some instances, processing of the substrate 325. The substrate support 406 is shown in an elevated processing position in FIG. 4, but may be vertically traversed by an actuator (not shown) coupled to the central shaft 432 to a loading position below the processing position. When lowered below the processing position, lift pins (not shown) contact the substrate 325 and raise the substrate 325 from the substrate support 406. A robot (not shown) may then enter the process chamber 400 to engage and remove the substrate 325 therefrom though the loading port. The substrate support 406 then may be actuated vertically to the processing position to place the substrate 325, with its device side 416 facing up, on a front side 410 of the substrate support 406.

The substrate support 406, while located in the processing position, divides the internal volume of the process chamber 400 into a process gas region 456 that is above the substrate 325, and a purge gas region 458 below the substrate support 406. The substrate support 406 is rotated during processing by the central shaft 432 to minimize the effect of thermal and process gas flow spatial anomalies within the process chamber 400 and thus facilitate uniform processing of the substrate 325. The substrate support 406 may be formed from silicon carbide or graphite coated with silicon carbide to absorb radiant energy from the lamps 402 and conduct the radiant energy to the substrate 325.

In general, the central window portion of the upper dome 428 and the bottom of the lower dome 414 are formed from an optically transparent material such as quartz. The thickness and the degree of curvature of the upper dome 428 may be configured to provide a flatter geometry for uniform flow uniformity in the process chamber.

The array of lamps 402 can be disposed adjacent to and beneath the lower dome 414 in a specified, optimal desired manner around the central shaft 432 to independently control the temperature at various regions of the substrate 325 as the process gas passes over, which facilitates the deposition of a material onto the upper surface of the substrate 325. While not discussed here in detail, the deposited material may include gallium arsenide, gallium nitride, or aluminum gallium nitride. In some embodiments, an array of radiant heating lamps, such as the lamps 402, may be disposed over the upper dome 428.

The lamps 402 may be configured to include bulbs configured to heat the substrate 325 to a temperature within a range of about 200 degrees C. to about 1600 degrees C. Each lamp 402 is coupled to a power distribution board (not shown) through which power is supplied to each lamp 402. The lamps 402 are positioned within a lamphead 445 which may be cooled during or after processing by, for example, a cooling fluid introduced into channels 449 located between the lamps 402. The lamphead 445 conductively and radiatively cools the lower dome 414 due in part to the close proximity of the lamphead 445 to the lower dome 414. The lamphead 445 may also cool the lamp walls and walls of reflectors (not shown) around the lamps. Alternatively, the lower dome 414 may be cooled by a convective approach. Depending upon the application, the lamphead 445 may or may not be in contact with the lower dome 414.

A circular shield 467 may be optionally disposed around the substrate support 406 and surrounded by a liner assembly 463. The shield 467 prevents or minimizes leakage of heat/light noise from the lamps 402 to the device side 416 of the substrate 325 while providing a pre-heat zone for the process gases. The shield 467 may be made from CVD SiC, sintered graphite coated with SiC, grown SiC, opaque quartz, coated quartz, or any similar, suitable material that is resistant to chemical breakdown by process and purging gases.

The liner assembly 463 is sized to be nested within or surrounded by an inner circumference of the base ring 436. The liner assembly 463 shields the processing volume (i.e., the process gas region 456 and purge gas region 458) from metallic walls of the process chamber 400. The metallic walls may react with precursors and cause contamination in the processing volume. While the liner assembly 463 is shown as a single body, the liner assembly 463 may include one or more liners with different configurations.

As a result of backside heating of the substrate 325 from the substrate support 406, the use of an optical pyrometer 418 for temperature measurements/control on the substrate support can be performed. This temperature measurement by the optical pyrometer 418 may also be done on the device side 416 of the substrate 325, having an unknown emissivity, since heating the substrate front side 410 in this manner is emissivity independent. As a result, the optical pyrometer 418 can only sense radiation from the hot substrate 325 that conducts heat from the substrate support 406, with minimal background radiation from the lamps 402 directly reaching the optical pyrometer 418.

A reflector 422 may be optionally placed outside the upper dome 428 to reflect light that is radiating off the substrate 325 back onto the substrate 325. The reflector 422 may be secured to the upper dome 428 using a clamp ring 430. The reflector 422 can be made of a metal such as aluminum or stainless steel. The efficiency of the reflection can be improved by coating a reflector area with a highly reflective coating such as gold. The reflector 422 can have one or more channels 426 connected to a cooling source (not shown). The channels 426 connect to a passage (not shown) formed on a side of the reflector 422 for cooling the reflector 422. The passage is configured to carry a flow of a fluid such as water and may run horizontally along the side of the reflector 422 in any desired pattern covering a portion or entire surface of the reflector 422.

Process gas supplied from a process gas supply source 472 is introduced into the process gas region 456 through a process gas inlet 474 formed in the sidewall of the base ring 436. The process gas inlet 474 is configured to direct the process gas in a generally radially inward direction. During the film formation process, the substrate support 406 may be located in the processing position, which is adjacent to and at about the same elevation as the process gas inlet 474, allowing the process gas to flow up and round along flow path 473 across the upper surface of the substrate 325 in a laminar flow. The process gas exits the process gas region 456 (along flow path 475) through a gas outlet 478 located on the side of the process chamber 400 opposite the process gas inlet 474. Removal of the process gas through the gas outlet 478 may be facilitated by a vacuum pump 480 coupled thereto. As the process gas inlet 474 and the gas outlet 478 are aligned with each other and disposed approximately at the same elevation, it is believed that such a parallel arrangement, when combined with a flatter upper dome 428 enables a generally planar, uniform gas flow across the substrate 325. Further radial uniformity may be provided by the rotation of the substrate 325 through the substrate support 406.

A purge gas may be supplied from a purge gas source 462 to the purge gas region 458 through an optional purge gas inlet 464 (or through the process gas inlet 474) formed in the sidewall of the base ring 436. The purge gas inlet 464 is disposed at an elevation below the process gas inlet 474. If the circular shield 467 or a pre-heat ring (not shown) is used, the circular shield or the pre-heat ring may be disposed between the process gas inlet 474 and the purge gas inlet 464. In either case, the purge gas inlet 464 is configured to direct the purge gas in a generally radially inward direction. During the film formation process, the substrate support 406 may be located at a position such that the purge gas flows down and round along flow path 465 across the back side 404 of the substrate support 406 in a laminar flow. Without being bound by any particular theory, the flowing of the purge gas is believed to prevent or substantially avoid the flow of the process gas from entering into the purge gas region 458, or to reduce diffusion of the process gas entering the purge gas region 458 (i.e., the region under the substrate support 406). The purge gas exits the purge gas region 458 (along flow path 466) and is exhausted out of the process chamber through the gas outlet 478, which is located on the side of the process chamber 400 opposite the purge gas inlet 464.

Figure 5:
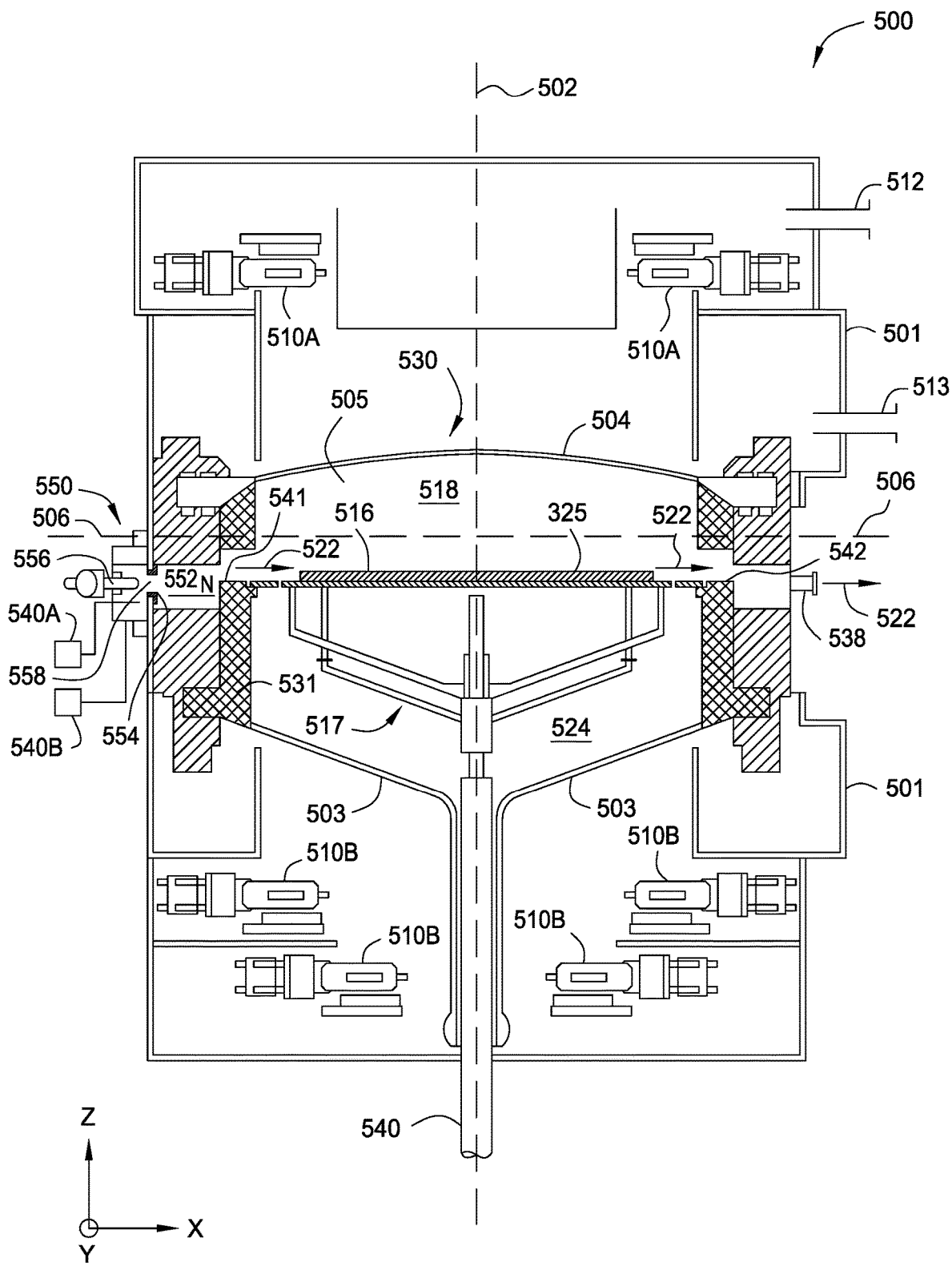
FIG. 5 is a schematic cross-sectional view of a CVD chamber for performing an epitaxial deposition process.

FIG. 5 is a schematic cross-sectional view of a CVD or epitaxial deposition process chamber 500, which may be part of a CENTURA® integrated processing system available from Applied Materials, Inc., of Santa Clara, California. The process chamber 500 includes housing structure 501 made of a process resistant material, such as aluminum or stainless steel, for example 316 L stainless steel. The housing structure 501 encloses various functioning elements of the process chamber 500, such as a quartz chamber 530, which includes an upper chamber 505, and a lower chamber 524, in which a processing volume 518 is contained. Reactive species are provided to the quartz chamber 530 by a gas distribution assembly 550, and processing byproducts are removed from processing volume 518 by an outlet port 538, which is typically in communication with a vacuum source (not shown).

A substrate support 517 is adapted to receive a substrate 325 that is transferred to the processing volume 518. The substrate support 517 is disposed along a longitudinal axis 502 of the process chamber 500. The substrate support 517 may be made of a ceramic material or a graphite material coated with a silicon material, such as silicon carbide, or other process resistant material. Reactive species from precursor reactant materials are applied to a surface 516 of the substrate 325, and byproducts may be subsequently removed from the surface 516. Heating of the substrate 325 and/or the processing volume 518 may be provided by radiation sources, such as upper lamp modules 510A and lower lamp modules 5106.

In one embodiment, the upper lamp modules 510A and lower lamp modules 5106 are infrared (IR) lamps. Non-thermal energy or radiation from lamp modules 510A and 5106 travels through upper quartz window 504 of upper quartz chamber 505, and through the lower quartz window 503 of lower quartz chamber 524. Cooling gases for upper quartz chamber 505, if needed, enter through an inlet 512 and exit through an outlet 513. Precursor reactant materials, as well as diluent, purge and vent gases for the process chamber 500, enter through gas distribution assembly 550 and exit through outlet port 538. While the upper quartz window 504 is shown as being curved or convex, the upper quartz window 504 may be planar or concave as the pressure on both sides of the upper quartz window 504 is substantially the same (i.e., atmospheric pressure).

The low wavelength radiation in the processing volume 518, which is used to energize reactive species and assist in adsorption of reactants and desorption of process byproducts from the surface 516 of substrate 325, typically ranges from about 0.8 µm to about 1.2 µm, for example, between about 0.95 µm to about 1.05 µm, with combinations of various wavelengths being provided, depending, for example, on the composition of the film which is being epitaxially grown.

The component gases enter the processing volume 518 via gas distribution assembly 550. Gas flows from the gas distribution assembly 550 and exits through port 538 as shown generally at 522. Combinations of component gases, which are used to clean/passivate a substrate surface, or to form the silicon and/or germanium-containing film that is being epitaxially grown, are typically mixed prior to entry into the processing volume. The overall pressure in the processing volume 518 may be adjusted by a valve (not shown) on the outlet port 538. At least a portion of the interior surface of the processing volume 518 is covered by a liner 531. In one embodiment, the liner 531 comprises a quartz material that is opaque. In this manner, the chamber wall is insulated from the heat in the processing volume 518.

The temperature of surfaces in the processing volume 518 may be controlled within a temperature range of about 200° C. to about 600° C., or greater, by the flow of a cooling gas, which enters through inlet 512 and exits through outlet 513, in combination with radiation from upper lamp modules 510A positioned above upper quartz window 504. The temperature in the lower quartz chamber 524 may be controlled within a temperature range of about 200° C. to about 600° C. or greater, by adjusting the speed of a blower unit which is not shown, and by radiation from the lower lamp modules 5106 disposed below lower quartz chamber 524. The pressure in the processing volume 518 may be between about 0.1 Torr to about 600 Torr, such as between about 5 Torr to about 30 Torr.

The temperature on the substrate 325 surface 516 may be controlled by power adjustment to the lower lamp modules 5106 in lower quartz chamber 524, or by power adjustment to both the upper lamp modules 510A overlying upper quartz window 504, and the lower lamp modules 5106 in lower quartz chamber 524. The power density in the processing volume 518 may be between about 40 W/cm$^2$ to about 400 W/cm$^2$, such as about 80 W/cm$^2$ to about 120 W/cm$^2$.

In one aspect, the gas distribution assembly 550 is disposed normal to, or in a radial direction 506 relative to, the longitudinal axis 502 of the process chamber 500 or substrate 325. In this orientation, the gas distribution assembly 550 is adapted to flow process gases in a radial direction 506 across, or parallel to, the surface 516 of the substrate 325. In one processing application, the process gases are preheated at the point of introduction to the process chamber 500 to initiate preheating of the gases prior to introduction to the processing volume 518, and/or to break specific bonds in the gases. In this manner, surface reaction kinetics may be modified independently from the thermal temperature of the substrate 325.

In operation, precursors to form Si and SiGe blanket or selective films are provided to the gas distribution assembly 550 from the one or more gas sources 540A and 540B. IR lamps 556 (only one is shown in FIG. 5) may be utilized to heat the precursors within the gas distribution assembly 550 as well as along the flow path 522. The gas sources 540A, 540B may be coupled the gas distribution assembly 550 in a manner configured to facilitate introduction zones within the gas distribution assembly 550, such as a radial outer zone and a radial inner zone between the outer zones when viewed in from a top plan view. The gas sources 540A, 540B may include valves (not shown) to control the rate of introduction into the zones.

The gas sources 540A, 540B may include silicon precursors such as silanes, including silane ($SiH_4$), disilane ($Si_2H_6$), dichlorosilane ($SiH_2Cl_2$), hexachlorodisilane ($Si_2Cl_6$), dibromosilane ($SiH_2Br_2$), higher order silanes, derivatives thereof, and combinations thereof. The gas sources 540A, 540B may also include germanium containing precursors, such as germane ($GeH_4$), digermane (Ge$_2$H$_6$), germanium tetrachloride (GeCl$_4$), dichlorogermane (GeH$_2$Cl$_2$), derivatives thereof, and combinations thereof. The silicon and/or germanium containing precursors may be used in combination with hydrogen chloride (HCl), chlorine gas (Cl$_2$), hydrogen bromide (HBr), and combinations thereof. The gas sources 540A, 540B may include one or more of the silicon and germanium containing precursors in one or both of the gas sources 540A, 540B.

The precursor materials enter the processing volume 518 through openings or a plurality of holes 558 (only one is shown in FIG. 5) in the perforated plate 554 in this excited state, which in one embodiment is a quartz material, having the holes 558 formed therethrough. The perforated plate 554 is transparent to IR energy, and may be made of a clear quartz material. In other embodiments, the perforated plate 554 may be any material that is transparent to IR energy and is resistant to process chemistry and other processing chemistries. The energized precursor materials flow toward the processing volume 518 through the plurality of holes 558 in the perforated plate 554, and through a plurality of channels 552N (only one is shown in FIG. 5). A portion of the photons and non-thermal energy from the IR lamps 556 also passes through the holes 558, the perforated plate 554, and channels 552N facilitated by a reflective material and/or surface disposed on the interior surfaces of the gas distribution assembly 550, thereby illuminating the flow path of the precursor materials (shown as arrow 522 in FIG. 5). In this manner, the vibrational energy of the precursor materials may be maintained from the point of introduction to the processing volume 518 along the flow path.

Figure 6:
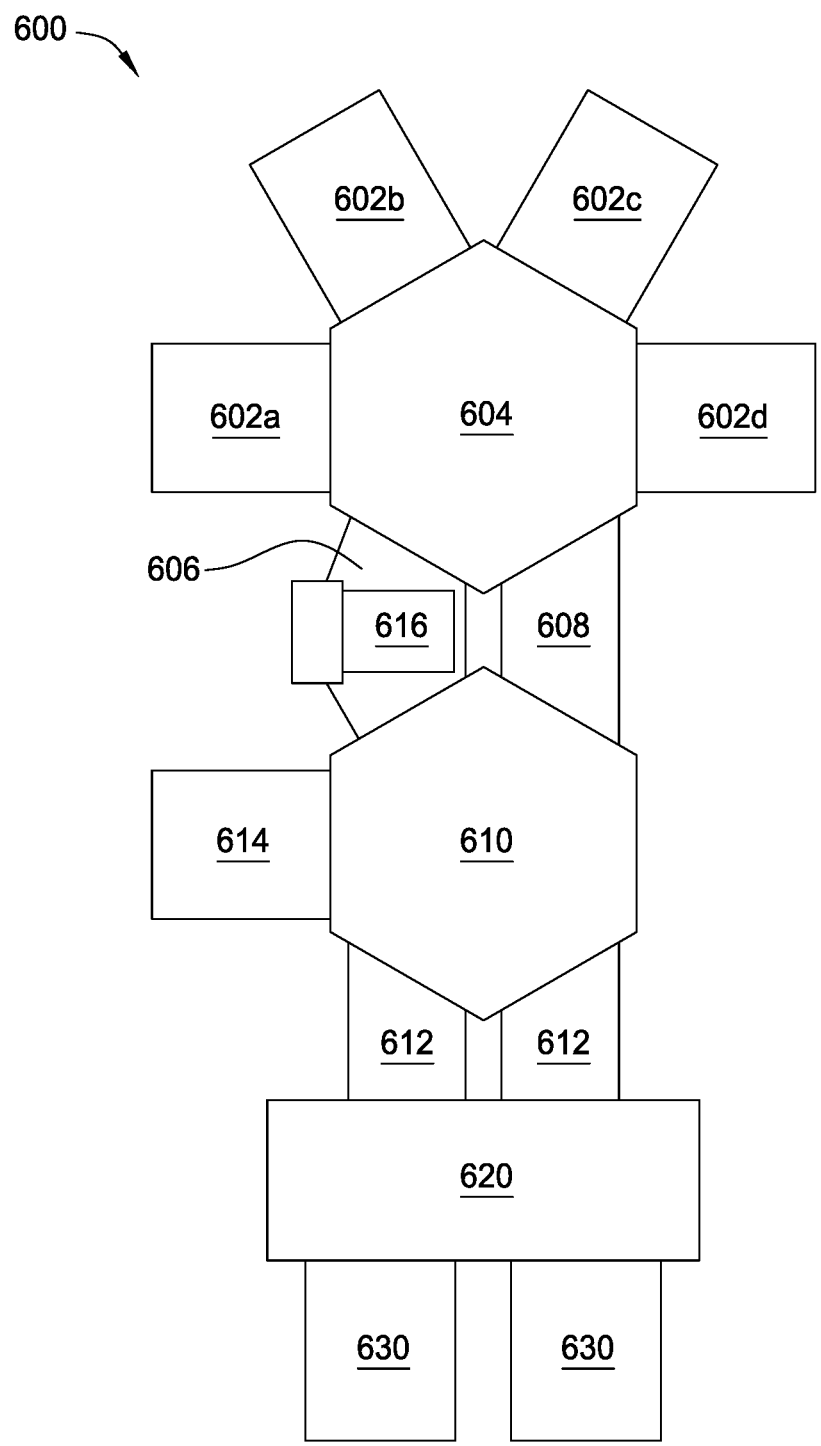
FIG. 6 illustrates an exemplary vacuum processing system for performing cleaning and deposition processes as described herein.

FIG. 6 illustrates an exemplary vacuum processing system 600 that can be used to complete the processing sequence 100 illustrated in FIG. 1, according to implementations of the present disclosure. As shown in FIG. 6, a plurality of processing chambers 602a, 602b, 602c, 602d are coupled to a first transfer chamber 604. The processing chambers 602a-602d may be used to perform any substrate related processes, such as annealing, chemical vapor deposition, physical vapor deposition, epitaxial process, etching process, thermal oxidation or thermal nitridation process, degassing etc. In one implementation, the processing chamber 602a may be a film formation chamber, such as a vapor phase epitaxy deposition chamber, for example an Epi chamber available from Applied Materials, Santa Clara, California, that is capable of forming a crystalline silicon or silicon germanium. In another implementation, the processing chamber 602a may be an epitaxy deposition chamber such as the single-substrate processing chamber (e.g., the reactor 300 described in connection with FIG. 3). In another implementation, the processing chamber 602a may be the process chamber 400 described in connection with FIG. 4. In another implementation, the processing chamber 602a may be the process chamber 500 described in connection with FIG. 5.

The processing chamber 602b may be a rapid thermal processing chamber (RTP). The processing chamber 602c is a plasma etching chamber or a plasma cleaning chamber. For example the processing chamber 602c may be the processing chamber 200 described in connection with FIG. 2A or the processing chamber 300 described in connection with FIG. 3. The processing chamber 602d may be a degassing chamber. The first transfer chamber 604 is also coupled to at least one transition station, for example a pair of pass-through stations 606, 608. The pass-through stations 606, 608 maintain vacuum conditions while allowing substrates to be transferred between the first transfer chamber 604 and a second transfer chamber 610. The first transfer chamber 604 has a robotic substrate handling mechanism (not shown) for transferring substrates between the pass-through stations 606, 608 and any of the processing chambers 602a-602d. The processing chambers 602a-602d are shown configured in a certain order in FIG. 6, but they may be configured in any desired order.

One end of the pass-through stations 606, 608 is coupled to the second transfer chamber 610. Therefore, the first transfer chamber 604 and the second transfer chamber 610 are separated and connected by the pass-through stations 606, 608. The second transfer chamber 610 is coupled to a first plasma-cleaning chamber 614, which can be a plasma chamber such as the processing chamber 200 (FIG. 2A) that is adapted to perform at least some of the processes found in box 602 for removing oxides from a surface of a substrate. In one implementation, the first plasma-cleaning chamber 614 is a Siconi™ or Selectra™ chamber, which is available from Applied Materials, Santa Clara, California. In another implementation, the plasma cleaning chamber 614 may be the processing chamber 200 described in connection with FIG. 2A. In another implementation, the plasma cleaning chamber 614 may be the processing chamber 300 described in connection with FIG. 3.

In one implementation, the at least one transition station, for example one of the pass-through stations 606, 608, is configured to be a plasma-cleaning chamber. Alternatively, a plasma-cleaning chamber may be coupled to one of the pass-through stations 606, 608 for removing contaminants from the surface of the substrate. Thus, the processing system 600 may have a second plasma-cleaning chamber that is, or is connected to, one of the pass-through stations 606, 608. In one implementation shown in FIG. 6, the pass-through station 606 includes a second plasma-cleaning chamber 616. The second plasma-cleaning chamber 616 may be a version of the processing chamber 300 (FIG. 3) that is adapted to perform at least some of the processes found in box 102 for removing contaminants from the surface of the substrate. It should be noted that, although only one plasma-cleaning chamber 616 is shown coupled to a pass-through station, in this case the pass-through station 606, a plasma-cleaning chamber (e.g., a version of the processing chamber 300) may be coupled to both the pass-through stations 606 and 608.

The second transfer chamber 610 also has a robotic substrate handling mechanism (not shown) for transferring substrates between a set of load lock chamber 612 and the first plasma-cleaning chamber 614 or the second plasma-cleaning chamber 616. A factory interface 620 is connected to the second transfer chamber 610 by the load lock chambers 612. The factory interface 620 is coupled to one or more pods 630 on the opposite side of the load lock chambers 612. The pods 630 typically are front opening unified pods (FOUP) that are accessible from a clean room (not shown).

While two transfer chambers are shown, it is contemplated that any of the transfer chambers may be omitted. In one implementation where the second transfer chamber 610 is omitted, the second plasma-cleaning chamber 616 may be disposed within or coupled to the first transfer chamber 604 at the location currently shown as occupied by the pass-through stations 606 or 608. The first transfer chamber 604 may be coupled to one or more processing chambers capable of forming crystalline silicon or silicon germanium, such as an epitaxy chamber, for example a Centura™ Epi chamber available from Applied Materials, Inc., of Santa Clara, California. Alternatively, the first transfer chamber 604 may be omitted and the second plasma-cleaning chamber 616 may be disposed within or coupled to the pass-through station 606, which is coupled to the second transfer chamber 610. In such a case, the second transfer chamber 610 may be configured to be coupled to one or more processing chambers capable of forming crystalline silicon or silicon germanium.

In operation, substrates are carried from pods 630 to the vacuum processing system 600 in a transport cassette (not shown) that is placed within one of the load lock chambers 612. The robotic transport mechanism within the second transfer chamber 610 transports the substrates, one at a time, from the load lock chambers 612 to the first plasma-cleaning chamber 614 where the a cleaning process, e.g., processes found in box 102, is performed to remove oxides from a surface of a substrate. Once the oxides have been removed from the substrate surface, the robotic transport mechanism disposed within the second transfer chamber 610 transfers the substrate from the first plasma-cleaning chamber 614 to the second plasma-cleaning chamber 616 where a reducing process, e.g., processes found in box 103, is performed to remove contaminants such as carbon or hydrocarbons from the substrate surface. It is contemplated that the steps here may also be performed in the reverse order, i.e., using the robotic transport mechanism to transfer the substrate from the second plasma-cleaning chamber 616 to the first plasma-cleaning chamber 614. In either case, the clean substrates are then transferred by the robotic transport mechanism disposed within the first transfer chamber 604 from the second plasma-cleaning chamber 616 (or the first plasma-cleaning chamber 614) to one or more processing chambers 602a-602d. The one or more processing chambers 602a-602d may include an epitaxy process chamber where a layer formation process, such as the epitaxial deposition described in box 106, is performed.

Upon completion of processing in the one or more processing chambers 602a-602d, the robotic transport mechanism disposed within the first transfer chamber 604 moves the substrate from either one of the processing chambers 602 to the pass-through station 608. The substrate is then removed from the pass-through station 608 by the robotic transport mechanism disposed within the second transfer chamber 610 and transferred to the other load lock chamber 612 through which it is withdrawn from the vacuum processing system 600.

Since the processes of all three boxes 102, 103 and 106 of FIG. 1 are performed within the same vacuum processing system 600, vacuum is not broken as the substrate is transferred among various chambers, which decreases the chance of contamination and improves the quality of the deposited epitaxial film. It should be understood that the movement of the substrates is described herein for illustration purposes. A controller (not shown) may be used to schedule the movement of the substrates through the vacuum processing system 600 in accordance with a desired sequencing program, which may vary depending upon the application.

Benefits of the present disclosure include an improved vacuum processing system integrating two different types of pre-clean process chambers with the epitaxial process chamber on the same vacuum processing system. The pre-clean process chambers may include a first plasma-cleaning process chamber and a second plasma-cleaning process chamber. Co-existence of two types of surface materials removal chamber on the same vacuum processing system allows substrates to remain in vacuum between surface preparation and epitaxial deposition, which reduces the time the substrates are exposed to ambient and eliminates the need to prepare the substrates on a separate processing chamber or system. This architecture also maximizes the number of process chambers on a vacuum system because the pass-through station between two transfer chambers also functions as a pre-clean process chamber, which also reduces overall handling time of the substrates.

An example of the process 102 of FIG. 1 can be performed in the processing chamber 200 of FIG. 2A. Argon is routed through the remote plasma unit 224, a first mixture of 5-10% HF in argon is routed through the inlet 256, and a second mixture of 25% $NH_3$ in argon is routed through the inlet 258. The remote plasma is formed by applying 500 W of microwave or RF power to argon gas flowing at 2 sLm. The first mixture is flowed through the first inlet 256 at 500 sccm and the second mixture is flowed through the second inlet 258 at 500 sccm. The substrate is maintained at a temperature of 10 degrees Celsius by routing temperature control fluid through the thermal control plenum 235. The substrate support 232 may be powered to provide radial temperature control. The chamber is maintained at a pressure of 5 Torr, and the substrate is processed for a time suitable for converting all desired oxides on the substrate surface into sublimable solid, for example 300 seconds. The substrate is then moved close to the second gas distributor 230, which is heated to about 200 degrees Celsius to provide radiant or conductive heating to the substrate surface. The substrate is maintained in proximity to the heat radiating from the second gas distributor 230 for 1-5 minutes to sublime the solids formed on the substrate surface, leaving an oxygen-free surface. The substrate may then be optionally heat-treated under an inert atmosphere to remove any residual species from the oxide removal process, such as fluorine containing species. The heat treatment may include disposing the substrate in a thermal treatment chamber and energizing a thermal treatment apparatus in the chamber to heat the substrate to a temperature of about 300 degrees Celsius for about 1 minute.

While the foregoing is directed to implementations of the present disclosure, other and further implementations of the disclosure may be devised without departing from the basic scope thereof.

The invention claimed is:

1. A method of processing a substrate, comprising:
disposing the substrate in a processing chamber;
forming a plasma from an inert gas in a cone shaped chamber disposed in a lid assembly of the processing chamber;
flowing the plasma from the cone-shaped chamber to a volume disposed in the lid assembly, the volume being upstream of a conduit;
flowing the plasma through the conduit in fluid communication with the cone shaped chamber into a mixing chamber disposed in the lid assembly with $NH_3$ and HF to form a reaction mixture, the mixing chamber having a sidewall that tapers inwardly from the conduit to the processing chamber;
flowing the reaction mixture into the processing chamber;
removing oxide from a substrate by a process that includes exposing the substrate to the reaction mixture; and
forming a film on the substrate by a vapor phase epitaxy process.

2. The method of claim 1, further comprising cooling the substrate while removing oxide from the substrate.

3. The method of claim 1, further comprising performing a thermal treatment process on the substrate after removing oxide from the substrate.

4. The method of claim 3, wherein the thermal treatment process is performed under an inert atmosphere at a temperature of 400 degrees Celsius or higher.

5. The method of claim 1, wherein the oxide removal process further comprises heating the substrate to a temperature of at least 100 degrees Celsius after the exposure to the reaction mixture.

6. The method of claim 5, further comprising:
   after removing oxide from the substrate, performing a thermal treatment process on the substrate, comprising disposing the substrate in a thermal treatment chamber;
   flowing an inert gas into the thermal treatment chamber; and
   heating the substrate to a temperature of 400 degrees Celsius or greater.

7. The method of claim 6, wherein the forming the film on the substrate is performed in the same chamber as the thermal treatment.

8. The method of claim 7, wherein performing the thermal treatment process further comprises exposing the substrate to a hydrogen containing gas.

9. The method of claim 1, wherein the conduit is a central conduit.

\* \* \* \* \*